ns228B2

(12) United States Patent
Wang et al.

(10) Patent No.: US 8,002,228 B2
(45) Date of Patent: Aug. 23, 2011

(54) ROTARY SUPPORTING STRUCTURE WITHOUT DRAWING

(75) Inventors: Keng-Ping Wang, Taipei (TW); Chin-Chang Meng, Taipei (TW); Chih-Ching Chen, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 0 days.

(21) Appl. No.: 12/465,774

(22) Filed: May 14, 2009

(65) Prior Publication Data

US 2009/0321602 A1    Dec. 31, 2009

(30) Foreign Application Priority Data

Jun. 27, 2008  (TW) .............................. 97124009 A (51) Int. Cl.
*A47B 91/00*  (2006.01)
*A47B 95/00*  (2006.01)

(52) U.S. Cl. ............. 248/349.1; 248/292.13; 248/291.1; 248/349.01

(58) Field of Classification Search ............. 248/292.13, 248/289.31, 220.21, 220.22, 229.8, 205.4, 248/205.3, 415, 349.1, 346.01, 291.1
See application file for complete search history.

(56) References Cited

U.S. PATENT DOCUMENTS

| 602,625 | A | * | 4/1898 | Fave ............................ 74/551.4 |
| 4,436,042 | A | * | 3/1984 | Hanyu et al. ............... 112/217.1 |
| 5,743,756 | A | * | 4/1998 | Hasz et al. ..................... 439/364 |
| 6,017,176 | A | * | 1/2000 | Marui .............................. 411/82 |
| 6,603,656 | B2 | * | 8/2003 | Cho et al. ................. 361/679.02 |
| 6,629,801 | B2 | * | 10/2003 | Cheng ........................... 403/101 |
| 7,025,311 | B1 | * | 4/2006 | Gretz ............................ 248/156 |
| 7,290,741 | B1 | * | 11/2007 | Cox et al. ..................... 248/188.4 |
| 7,328,880 | B2 | * | 2/2008 | Helot et al. .............. 248/346.01 |
| 7,523,912 | B1 | * | 4/2009 | Woods .......................... 248/415 |
| 7,528,322 | B1 | * | 5/2009 | Gretz .............................. 174/57 |
| 2001/0022336 | A1 | * | 9/2001 | Sawayanagi ............. 248/292.12 |

* cited by examiner

*Primary Examiner* — Amy J Sterling
(74) *Attorney, Agent, or Firm* — Muncy, Geissler, Olds & Lowe, PLLC (57) ABSTRACT

A rotary supporting structure without drawing is provided. A base is designed to have a protrusion to cooperate with a locating hole of an electronic device to make the base rotate between the accommodating position coinciding with the bottom surface of the electronic device and the supporting position intersecting with the bottom surface without drawing. The tenons used in the conventional design are replaced, and thus the operation is more convenient. The base is composed of an upper lid and a lower lid, and this may overcome the thickness limitation of the conventional single plastic component and provide stable support.

21 Claims, 7 Drawing Sheets

ROTARY SUPPORTING STRUCTURE WITHOUT DRAWING

BACKGROUND OF THE INVENTION

1. Field of Invention

The invention relates to a rotary supporting structure without drawing used for an electronic device which needs to be erected and, more particularly, to a rotary supporting structure without drawing positioned by a protrusion.

2. Description of the Related Art

Nowadays, some of the electronic devices seen in daily life are disposed horizontally, and some are disposed vertically. Besides, some electronic devices are able to be disposed both vertically and horizontally, such as some modems, wireless access points and other devices. Usually, if the electronic device needs to be disposed vertically, since the center of gravity of the electronic device is not stable, a supporting bracket is additionally needed to support the electronic device.

Since the electronic device is separate from the supporting bracket, users often lose the supporting bracket. The existence of the supporting bracket not only increases the number of wrapper to fail to meet the requirement of environmental protection, but also increases the volume and weight to increase the transferring and manufacturing cost. In addition, the designer would consume much time in designing the device, the supporting bracket and the wrapper to match them properly. However, the existence of the supporting bracket makes the electronic device unable to be identical with the supporting bracket in appearance. Thus, the aesthetic feeling of the electronic device is limited greatly.

Figure 5:
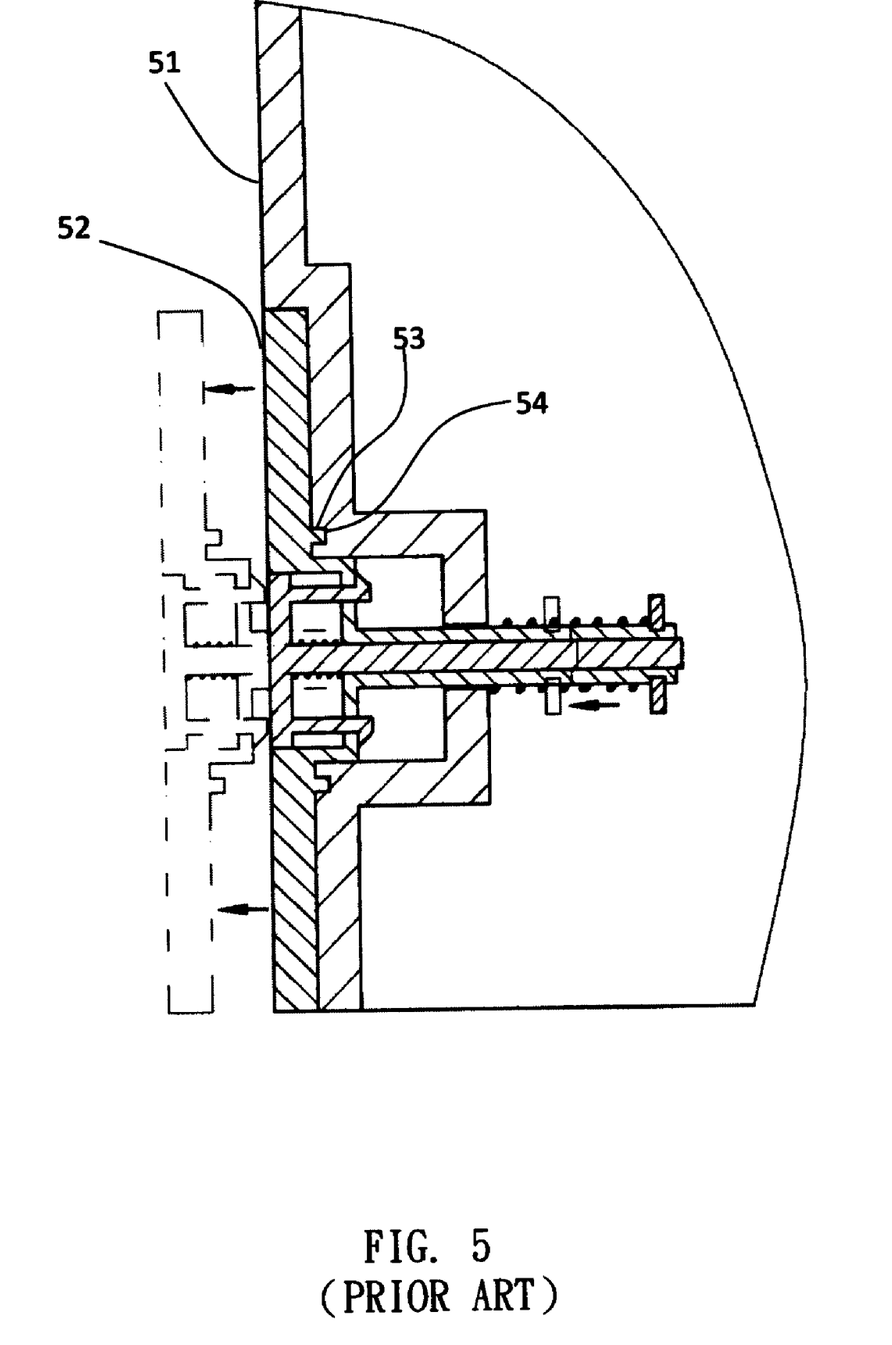
FIG. 5 is a schematic diagram showing the rotary supporting structure in the prior art.

As shown in FIG. 5, the supporting board 52 pivotally disposed at a datum surface 51 may be rotated to the position coinciding with the datum surface 51 to achieve the objective of being disposed horizontally or accommodated without affecting the consistency in appearance. The supporting board 52 also may be rotated to the position intersecting with the datum plane 51 to get a bigger supporting surface. Thus, the electronic device is supported to be vertical stably.

However, in this or other similar designs, the positioning objective is achieved by tenons 53. That is, two tenons 53 on the supporting board 52 are used to cooperate with the two indentation holes 54 on the datum plane 51 to locate the supporting board at the two positions. The stability of positioning is ensured by using the tenons 53. However, since the tenons 53 have certain lengths, in actual application, the supporting board 52 has to be drawn out for a certain distance, and only when the tenons 53 leave the indentation holes 54 can the supporting board 52 be rotated to change the positioning condition. This is not convenient in operation, and the tenons 53 are easy to be snapped after a long time usage. Once they are snapped, the locating effect is lost, and the supporting board 52 cannot be fixed.

In addition, generally, the supporting board 52 and the cover of the electronic device are usually manufactured in a plastic ejecting mode. A single plastic ejecting component has the limitation in thickness, and it may be only three millimeters. To some devices which are heavier or have a bigger height-width ratio, the supporting board of three millimeters is thin, and the stable supporting effect when the electronic device is disposed vertically is hard to be achieved.

BRIEF SUMMARY OF THE INVENTION

According to the rotary supporting structure without drawing disclosed in the invention, the supporting structure includes a base, an elastic element and a limiting element. The base is composed of an upper lid and a lower lid. The lower lid has a pivot, and the upper lid has a through hole and at least a protrusion. The pivot of the lower lid goes through the through hole of the upper lid to make the upper lid and the lower lid form a base. Then, the base is disposed at the bottom surface of the electronic device, and the pivot goes through the pivotal hole of the bottom surface. The elastic element is sleeved on the pivot from the inside of the electronic device, and the limiting element is disposed at the end of the pivot. Thus, the moving scope of the elastic element is limited.

The base may rotate relative to the electronic device to the accommodating position coinciding with the bottom surface or the supporting position intersecting with the bottom surface to get a bigger supporting surface. The protrusion of the upper lid cooperates with the locating hole of the bottom surface of the electronic device to locate the base in the accommodating position and the supporting position. Since the protrusion is designed to be circular-shaped and the locating hole is designed to have a filleted edge, the base is rotated to change its position between the accommodating position and the supporting position directly without drawing. Thus, the disadvantage that a tenon used to position an electronic device is not only hard to operate, but also easy to break is overcome.

In another aspect, the base is formed with the upper lid and the lower lid, and thus the thickness of the base is not limited by the plastic ejecting mode, and the whole thickness of the base increases. Even though the electronic device is heavy or has a bigger height-width ratio, it also may be supported stably in the supporting position, and a good supporting effect is achieved.

These and other features, aspects and advantages of the present invention will become better understood with regard to the following description, appended claims, and accompanying drawings.

DETAILED DESCRIPTION OF THE EMBODIMENTS

Figure 1A:
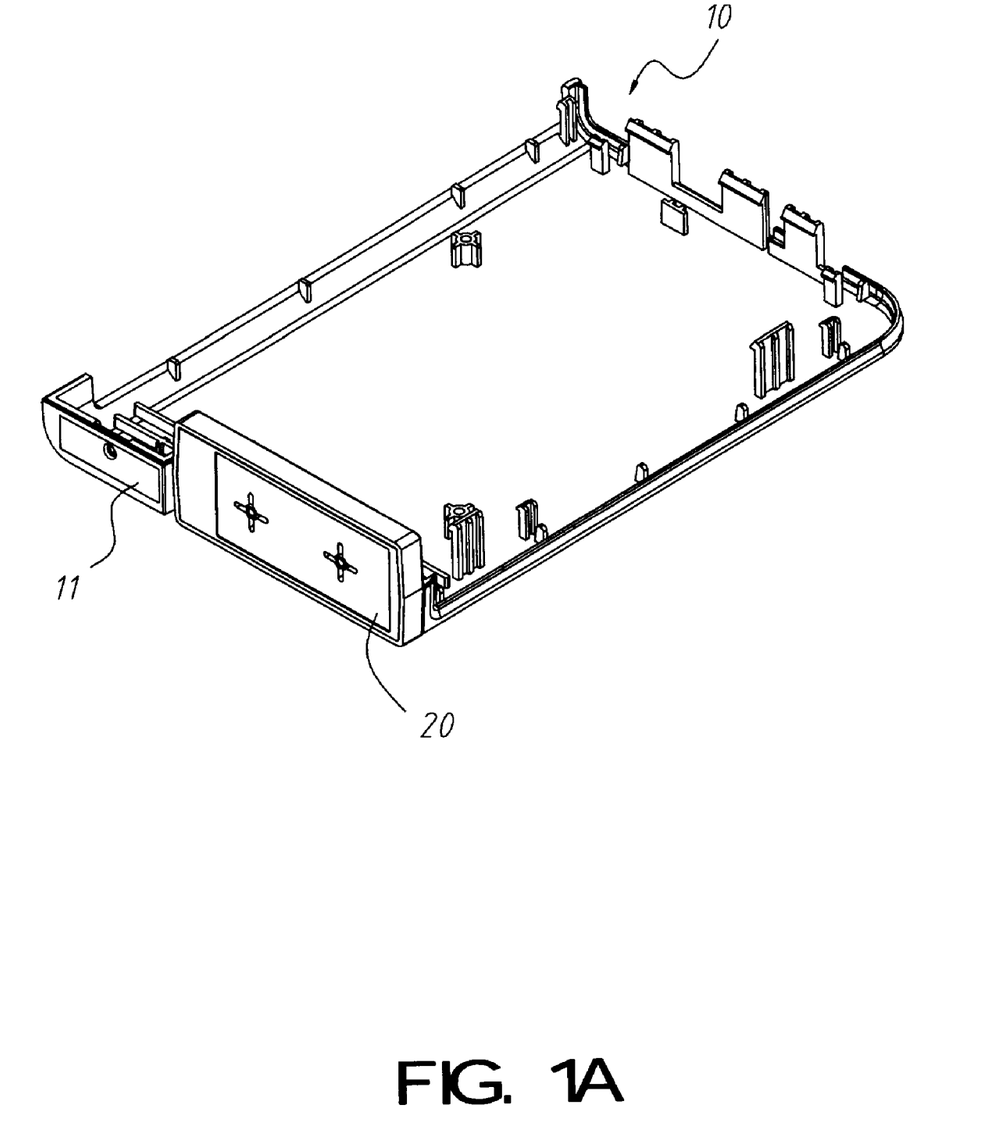
FIG. 1A and FIG. 1B are schematic diagrams showing the using state of the electronic device using the rotary supporting structure without drawing.
Figure 1B:
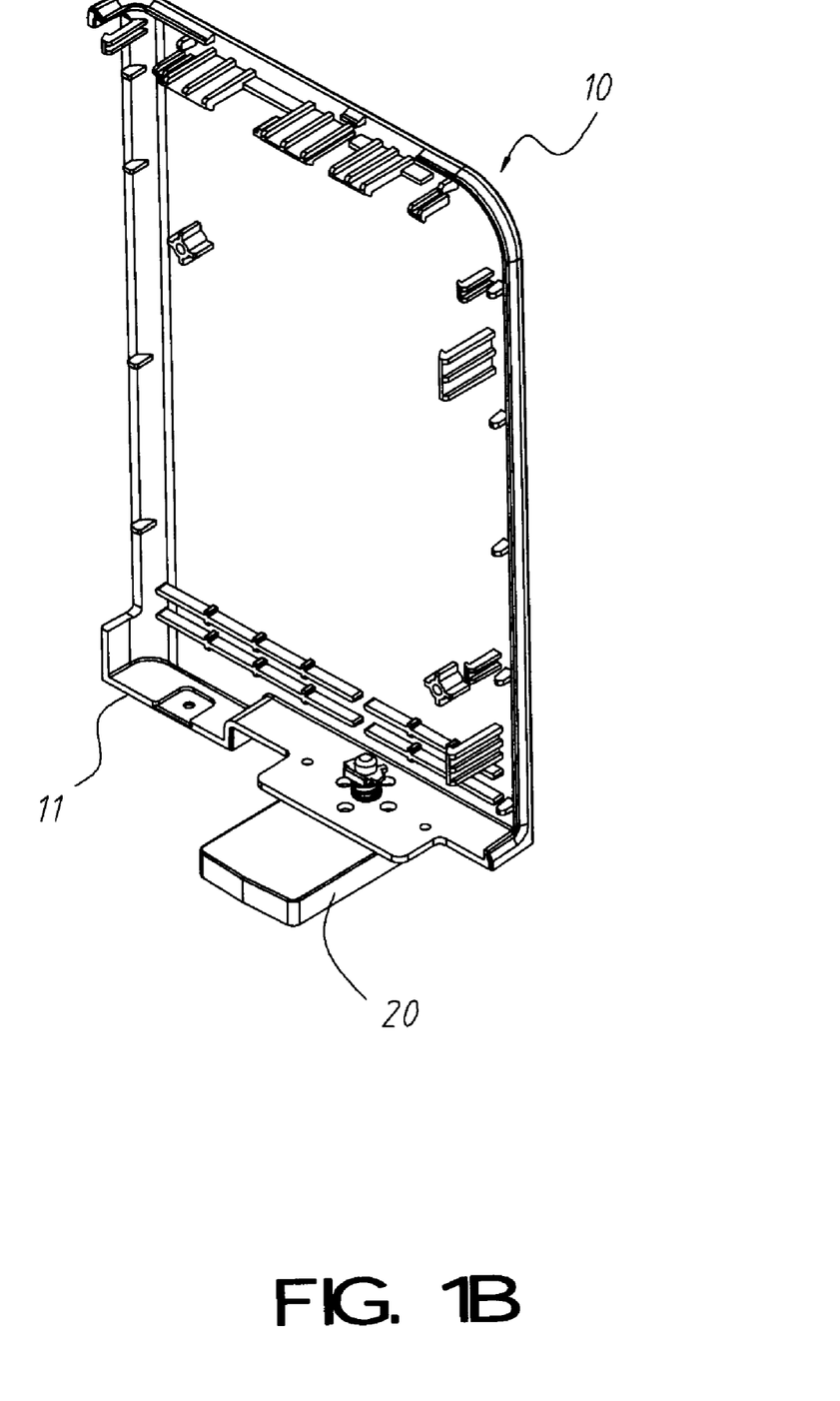

According to the rotary supporting structure without drawing in the invention, as shown in FIG. 1A and FIG. 1B, they are schematic diagrams showing the using state of the electronic device using the rotary supporting structure without drawing.

The electronic device body 10 has a bottom surface 11 to be disposed vertically. In FIG. 1A and FIG. 1B, the electronic device body 10 is replaced by a case to make the inside connecting mode more clear. Normally, the electronic device body 10 is disposed horizontally, as shown in FIG. 1A, and a base 20 is pivotally disposed on the bottom surface 11 to allow the base 20 to rotate relative to the bottom surface 11 of the electronic device body 10. Thus, the base may rotate to the accommodating space coinciding with the bottom surface 11 (as shown in FIG. 1A), and it also may rotate to the supporting position intersecting with the bottom surface 11 (as shown in FIG. 1B). In other words, if the electronic device body 10 is required to be disposed vertically, as shown in FIG. 1B, the base 20 may be rotated to the supporting position intersecting with the bottom surface 11, and that is, the base 20 is substantially perpendicular to the bottom surface 11 to achieve better supporting effect. Thus, the base 20 may support the electronic device body 10 to be vertical stably in the supporting position. If the electronic device body 10 only needs to be disposed horizontally, as shown in FIG. 1A, the base 20 may be rotated to the position coinciding with the bottom surface 11. Since the base 20 coincides with the bottom surface 11, the consistency of the appearance of the electronic device body 10 is not affected.

Figure 2:
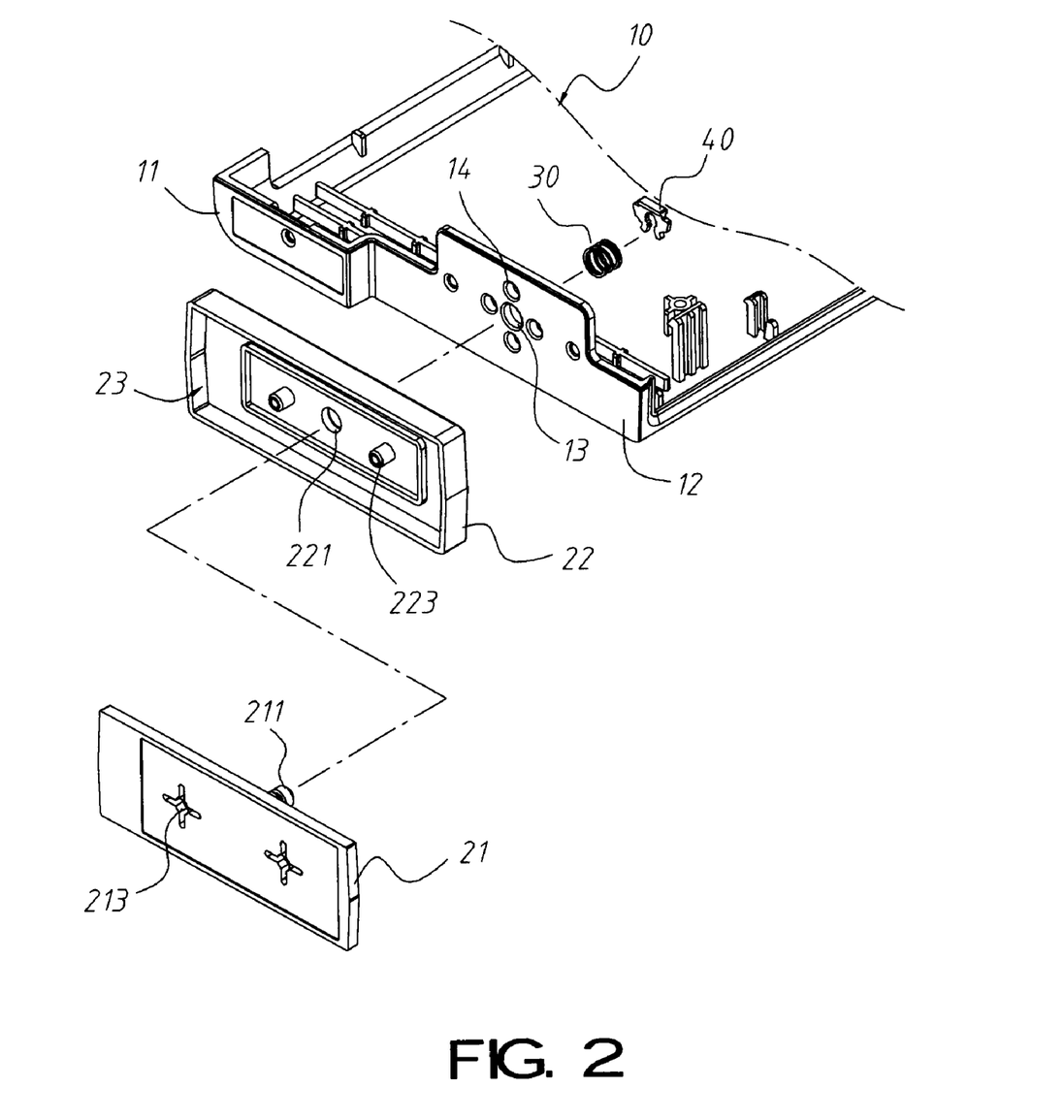
FIG. 2 is a schematic diagram showing the structure of the rotary supporting structure without drawing in the embodiment of the invention.
Figure 3:
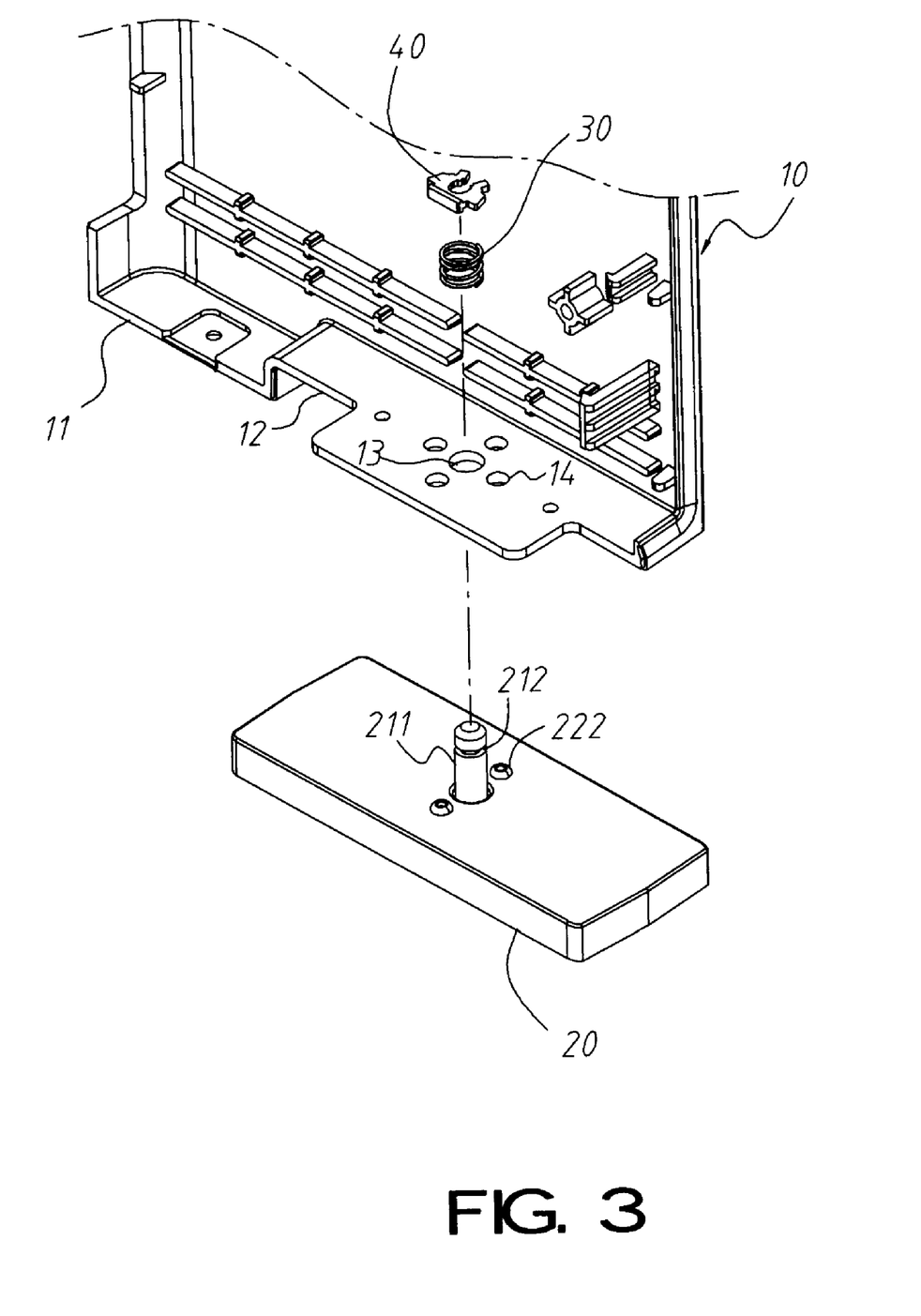
FIG. 3 is a schematic diagram showing the structure of the rotary supporting structure without drawing in the embodiment of the invention.

As shown in FIG. 2 and FIG. 3, they are schematic diagrams showing the structure of the rotary supporting structure without drawing in the invention.

The supporting structure includes a base 20, an elastic element 30 and a limiting element 40. The base 20 is composed of a lower lid 21 and an upper lid 22. Generally, the outer case of the electronic device body 10 and the base 20 are manufactured in a plastic ejecting mode to save the material cost. However, the single plastic ejecting component has limitation in thickness. The base 20 is designed to be the composition of the lower lid 21 and the upper lid 22 to overcome the limitation of thickness. The lower lid 21 is approximately flat, and a protruding pivot 211 is located at the center of the lower lid 21. The end of the pivot 21 has a recess 212, and two fixing holes 213 are located at both sides of the pivot 211, respectively.

The upper lid 22 is approximately cover-shaped, and a through hole 221 corresponding to the pivot 211 of the lower lid 21 is located at the center to allow the pivot 211 to enter. Two fixing pillars 223 corresponding to the fixing holes 213 of the lower lid 21 are located at the bottom of the upper lid 22. The fixing pillars 223 and the fixing holes 213 are tight fitted to make the upper lid 22 connected to the lower lid 21. To facilitate the tight fitting of the fixing pillars 223, the fixing holes 213 may be designed to be cross-shaped slots. In addition, they also may be designed to be circle-shaped holes, rectangle-shaped holes or holes having other shapes whose external diameters are smaller than those of the fixing pillars 223. In another aspect, besides the closely fitting mode, the screwing mode, the heat fusing mode, the sticking mode and other modes also may be used to connect the upper lid 22 and the lower lid 21.

After a base 20 is formed by connecting the upper lid 22 and the lower lid 21, the pivot 211 goes through the pivotal hole 13 of the electronic device body 10 to allow the base 20 to rotate relative to the electronic device body 10. The area where the bottom surface 11 of the electronic device body 10 corresponds to the base 20 is an indentation area 12. The shape and the depth of indentation area 12 are designed to correspond to those of the base 20. Therefore, when the base 20 rotates to the accommodating position coinciding with the bottom surface 11 (as shown in FIG. 1A), the bottom surface 11 and the base 20 completely attach to each other, and it seems that the base 20 is a part of the bottom surface 11. The base 20 is concealed at the bottom surface 11 to keep consistency of the appearance of the electronic device body 10.

Since the base 20 is composed of the lower lid 21 and the upper lid 22, the whole base 20 is thicker than the single component. When the electronic device body 10 is heavy or has a bigger height-width ratio, and in other words, when the area or the minor edge of the bottom surface 11 is much smaller than the height of the electronic device body 10 when the electronic device body 10 is perpendicular, the conventional single component is too slight to support the electronic device, and if serious, it is easy to be bent or broken. Therefore, the base 20 is designed to be formed by an upper lid and a lower lid to overcome the disadvantage of the conventional limitation in thickness. Furthermore, the upper lid 22 is designed to be cover-shaped, and when it is connected to the lower lid 21, an accommodating space 23 is formed at the center to dispose electronic components (not shown) such as an wireless receiver to allow a peripheral equipment such as a wireless mouse to be used directly. In addition, although the base 20 is hollow in the center and has an accommodating space 23, the fixing pillars 223 and the fixing holes 213 are connected to each other as props or ribs to reinforce the supporting strength of the base 20 without affecting the supporting strength and the supporting firmness of the whole supporting structure. In another aspect, besides the accommodating space 23, the electronic components also may be embedded on the lower lid 21. Since the thickness of the conventional single component is small, the electronic component cannot be disposed like this effectively.

After the pivot 211 goes through the pivotal hole 13 of the electronic device body 10, the elastic element 30 is sleeved on the pivot 211 from the inside of the electronic device body 10. Then, the limiting element 40 is disposed on the recess 212 at the end of the pivot 211, and it is used to ensure that the pivot 211 does not leave the pivotal hole 13. The elastic element 30 is, for example, a compression spring. The limiting element 40 is a retaining ring such as a washer, a C-clip, an E-clip or one of other retaining rings disposed at the recess 212 at the end of the pivot 211. In other words, it is disposed at the external side of the elastic element 30 to prevent the elastic element 30 from separating from the pivot 211. The limiting element 40 also may be made of plastic, such as the plastic washer, and it is convenient for disposing the limiting element 40 at the recess 212 at the end of the pivot 211.

Figure 4A:
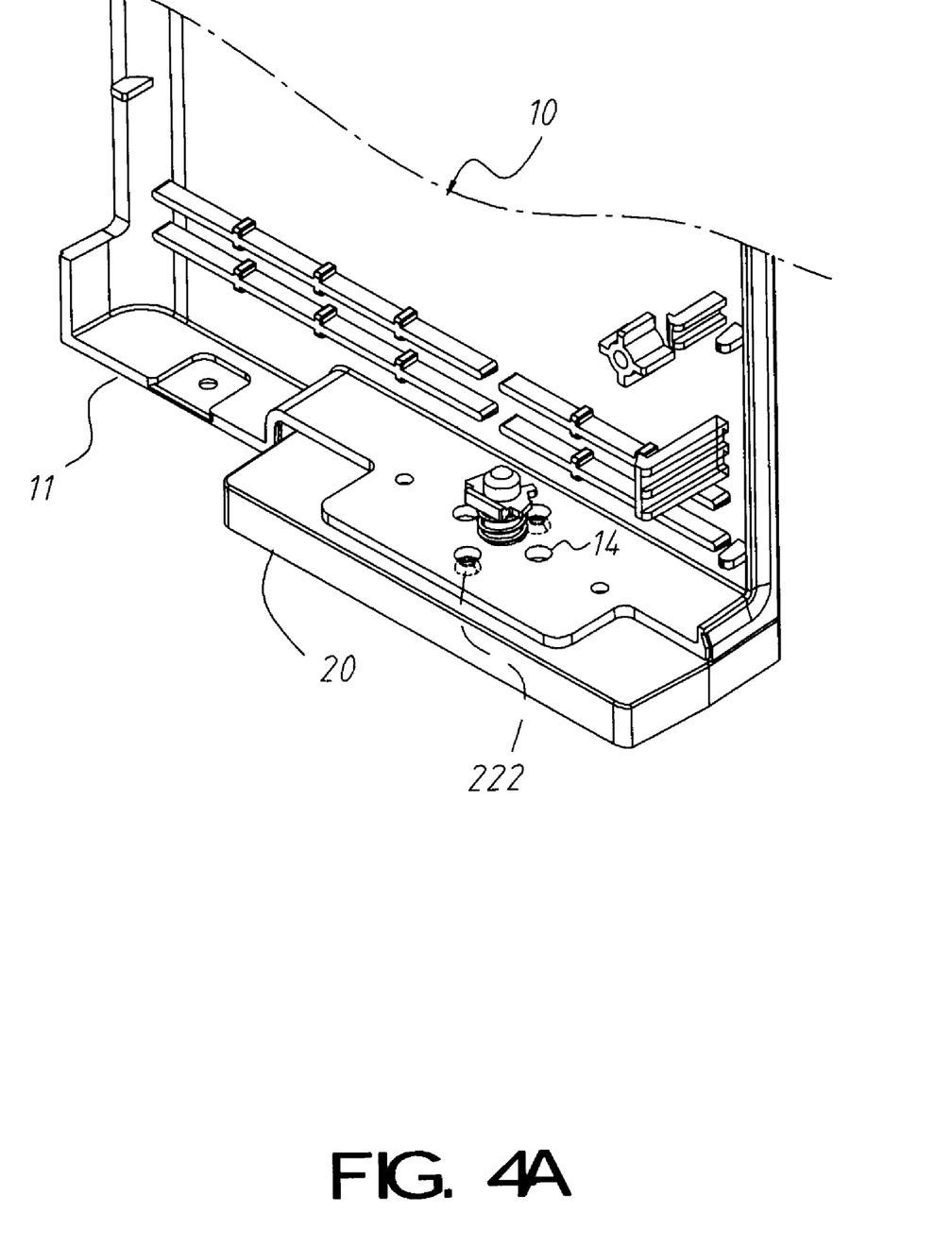
FIG. 4A is a schematic diagram showing that the rotary supporting structure without drawing in the embodiment of the invention is located to the accommodating position.
Figure 4B:
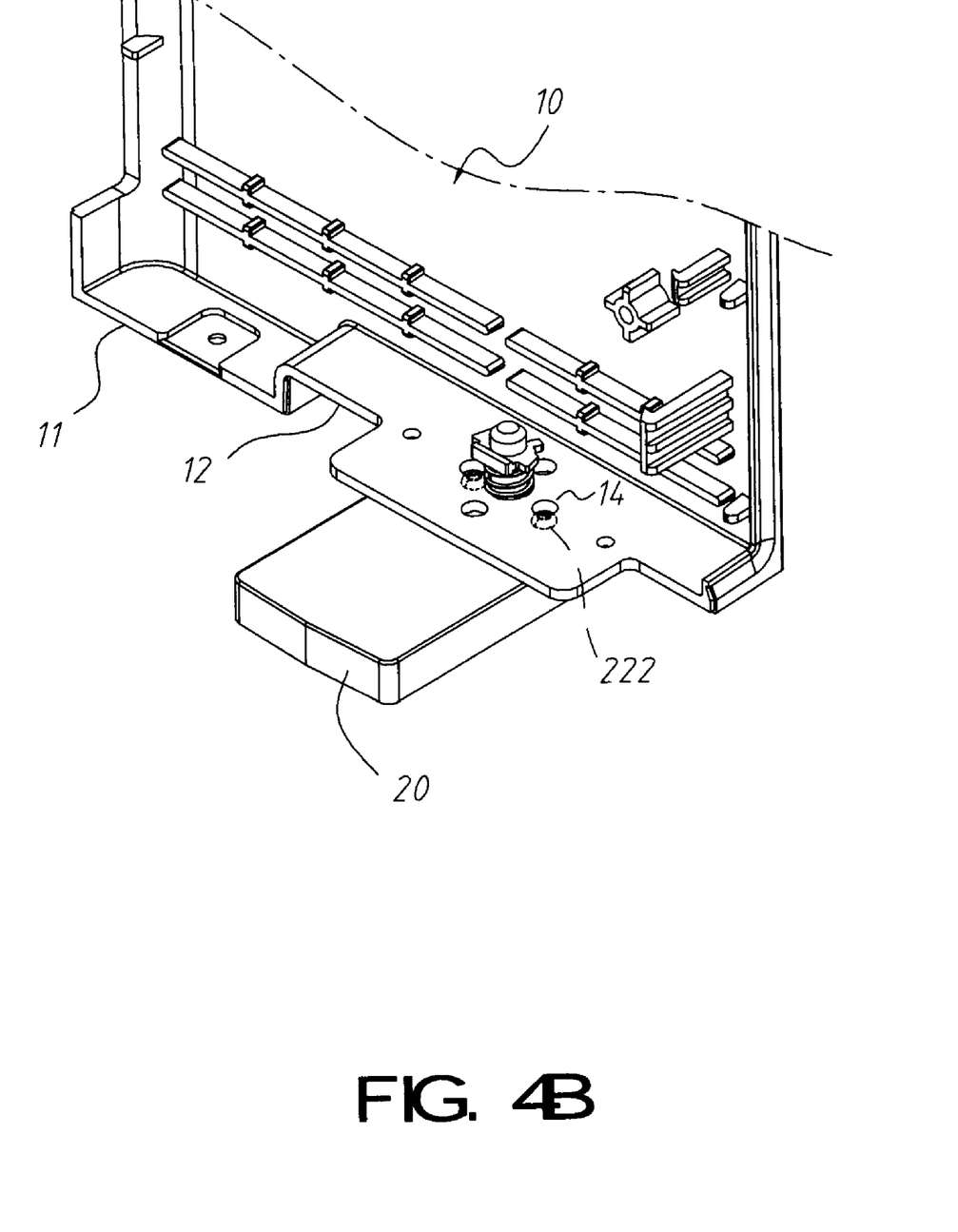
FIG. 4B is a schematic diagram showing that the rotary supporting structure without drawing in the embodiment of the invention is located to the supporting position.

As shown in FIG. 4A and FIG. 4B, they are schematic diagrams showing that the rotary supporting structure without drawing in the embodiment of the invention is located at the accommodating position and the supporting position.

In addition, two protrusions 222 are located at the upper lid 22, and four locating holes 14 are located at the position corresponding to the protrusions 222 around the pivotal hole 13 at the indentation area 12 of the electronic device body 10. The protrusions 222 cooperate with the locating holes 14 to locate the position of the base. Due to the circle-shaped protrusions 222, the filleted edge of the locating holes and the cooperation of the elastic element 30 and the limiting element 40, a certain elastic restoring force acts on the base 20 along the pivot 211. Due to the cooperation of the protrusion 222 and the locating hole 14, the base 20 is rotated by a slight push, and a drawing action for rotating the component along the pivot 211 in the conventional component is not needed. Furthermore, the base 20 is ensured to rotate to the accommodating position (as shown in FIG. 4A) or the supporting position (as shown in FIG. 4B) without falling off easily by the restoring force along the pivot 211 provided by the elastic element 30.

Therefore, in the rotary supporting structure without drawing of the invention, the protrusion is designed to replace the conventional tenons to rotate the base directly without drawing to change the position between the accommodating position and the supporting position. Thus, the disadvantages that the tenons are hard to be operated and easy to be broken are overcome. In another aspect, the base is composed of the upper lid and the lower lid, and the thickness limitation of the conventional single plastic ejecting component is overcome. Thus, the whole thickness of the base increases, and even if the electronic device is heavy, or its height-width ratio is big, the stable supporting effect at the supporting position also may be achieved. Furthermore, since the thickness increases, electronic components may be disposed on the base to increase the functions of the supporting structure.

What is claimed is:

1. An electronic device comprising:
a body, having a indentation area and a pivotal hole at a surface of the body; and
a base disposing at the indentation area, the base has a lower lid and an upper lid, a pivot of the lower lid goes through a through hole of the upper lid to form the base, and the pivot links the body through the pivotal hole to make the base rotate relatively to the body;
wherein the base is at an accommodating position when the base coincides with the indentation area, and the base is at a supporting position when the base intersects with the indentation area;
wherein the lower lid has a fixing hole, the upper lid has a fixing pillar, and the upper lid is connected to the lower lid by fixing the fixing pillar with the fixing hole in a tight fitting mode.

2. The electronic device according to claim 1, further comprising an elastic element disposed at the pivot to prevent the pivot of the base from separating from the pivotal hole.

3. The electronic device according to claim 2, further comprising a limiting element disposed at the end of the pivot to prevent the elastic element from being separated.

4. The electronic device according to claim 3, wherein the pivot has a recess to dispose the limiting element.

5. The electronic device according to claim 3, wherein the limiting element is a retaining ring.

6. The electronic device according to claim 3, wherein the limiting element is a washer, a C-clip or an E-clip.

7. The electronic device according to claim 2, wherein the elastic element is a compression spring.

8. An electronic device comprising:
a body, having a indentation area and a pivotal hole at a surface of the body; and
a base disposing at the indentation area, the base has a lower lid and an upper lid with a protrusion, a pivot of the lower lid goes through a through hole of the upper lid to form the base, and the pivot links the body through the pivotal hole to make the base rotate relatively to the body;
wherein the base is at an accommodating position when the base coincides with the indentation area and locates the position at the base by the protrusion, and the base is at a supporting position when the base intersects with the indentation area;
wherein the lower lid has a fixing hole, the upper lid has a fixing pillar, and the upper lid is connected to the lower lid by fixing the fixing pillar with the fixing hole in a tight fitting mode.

9. The electronic device according to claim 8, further comprising an elastic element disposed at the pivot to prevent the pivot of the base from separating from the pivotal hole.

10. The electronic device according to claim 9, further comprising a limiting element disposed at the end of the pivot to prevent the elastic element from being separated.

11. The electronic device according to claim 10, wherein the pivot has a recess to dispose the limiting element.

12. The electronic device according to claim 10, wherein the limiting element is a retaining ring.

13. The electronic device according to claim 10, wherein the limiting element is a washer, a C-clip or an E-clip.

14. The electronic device according to claim 9, wherein the elastic element is a compression spring.

15. An electronic device comprising:
a body, having an indentation area and a pivotal hole at a surface of the body; and
a base disposing at the indentation area, the base has a lower lid and an upper lid, a pivot of the lower lid goes through a through hole of the upper lid to form the base with a space between, and the pivot links the body through the pivotal hole to make the base rotate relatively to the body;
wherein the base is at an accommodating position when the base coincides with the indentation area, and the base is at a supporting position when the base intersects with the indentation area;
wherein the lower lid has a fixing hole, the upper lid has a fixing pillar, and the upper lid is connected to the lower lid by fixing the fixing pillar with the fixing hole in a tight fitting mode.

16. The electronic device according to claim 15, further comprising an elastic element disposed at the pivot to prevent the pivot of the base from separating from the pivotal hole.

17. The electronic device according to claim 16, further comprising a limiting element disposed at the end of the pivot to prevent the elastic element from being separated.

18. The electronic device according to claim 16, wherein the pivot has a recess to dispose the limiting element.

19. The electronic device according to claim 17, wherein the limiting element is a retaining ring.

20. The electronic device according to claim 17, wherein the limiting element is a washer, a C-clip or an E-clip.

21. The electronic device according to claim 16, wherein the elastic element is a compression spring.

* * * * *